United States Patent [19]

Little et al.

[11] 4,443,488

[45] Apr. 17, 1984

[54] PLASMA ION DEPOSITION PROCESS

[75] Inventors: Roger G. Little, Bedford; Robert G. Wolfson, Concord; Stanley J. Solomon, Lexington, all of Mass.

[73] Assignee: Spire Corporation, Bedford, Mass.

[21] Appl. No.: 312,712

[22] Filed: Oct. 19, 1981

[51] Int. Cl.³ ............................................. B05D 3/06
[52] U.S. Cl. ........................................ 427/38; 427/86; 427/87; 427/93
[58] Field of Search ..................... 427/38, 86, 87, 93

[56] References Cited

U.S. PATENT DOCUMENTS

| | | | |
|---|---|---|---|
| 4,039,699 | 8/1977 | Morimoto et al. | 427/38 |
| 4,152,478 | 5/1979 | Takagi | 427/38 |
| 4,281,029 | 7/1981 | Takagi et al. | 427/38 |

OTHER PUBLICATIONS

Sol Aisenberg, et al., "Ion–Beam Deposition of Thin Films of Diamondlike Carbon," *J. App. Phys.*, 42 (7) 2953–2958, 1971.
C. Weissmantel et al., "Structure & Properties of Quasi--Amorphous Films Prepared by Ion Beam Techniques," *Thin Solid Films*, 72 (1980), 19–31.
C. Weissmantel, "Ion Beam Deposition of Special Film Structures," *J. Vac. Sci. Technol.*, 18(2), Mar. 1981, pp. 179–185.
G. Carter et al., "The Interaction of Low Energy Ion Beams w/Surfaces", *Thin Solid Films*, 80 (1981), 13–29.
G. Gautherin et al., "Some Trends in Preparing Film Structures by Ion Beam Methods," *Thin Solid Films*, 50 (1978) 135.
C. Weissmantel et al., "Preparation of Hard Coatings by Ion Beam Methods," *Thin Solid Films*, 63 (1979), 315–325.
M. Wakatsuki et al., "Synthesis of Polycrystalline Cubic BN", *Mat. Res. Bull.*, vol. 7, pp. 999–1004, 1972, Pergamon Press Inc.
C. Weissmantel et al., "Recent Developments in Ion–Activated Film Preparation", (1979)–cit. unknown at present.
T. Takagi et al., "Ion Beam Epitaxial Technique & Applications", pp. 174–185, cit. unknown at present.
A. R. Kirkpatrick et al., "A Nonconventional Approach to Thin Film Cell Fabrication," 13th IEEE Photovoltaic Sp. Conf. (1978), pp. 1342–1346.
L. C. Knights et al., "Microstructure of Plasma–Deposited A–Si H Films", Apply. Phys. Lett. 35(3), (1979), pp. 244–246.
Charles Fildmer et al., "Vacuum Deposited Polycrystalline Silver Solor Cells . . . ", 14th Photovoltaic Spec. Conf. (1980), pp. 391–396.
K. R. Sarme et al., "Self-Supporting Silicon Films . . . " 13th Photovoltaic Specialists Conference (1978), pp. 466–471.
W. A. Brown et al., "An Analysis of LPCVD System Parameters . . . ", *Solid State Technology (Jul. 1979), pp. 51–84*.

*Primary Examiner*—John D. Smith
*Assistant Examiner*—Janyce A. Bell
*Attorney, Agent, or Firm*—Morse, Altman & Dacey

[57] ABSTRACT

A plasma ion deposition process of large-grain, thin semiconductor films directly on low-cost amorphous substrates comprising ionizing a semiconductor-based gaseous compound in a chamber by an electron-supported large volume, low pressure, high temperature plasma. The semiconductor ions are extracted from the compound and are deposited on the substrate. Preferably, the deposition is effected first at a slow deposition rate, followed by a higher deposition rate. The deposited ions are permitted to coalesce into lattice clusters, which clusters are grown, by further deposition, into a large-grain, thin semiconductor film on the substrate. Preferably, the semiconductor-based gaseous compound includes silane gas with dopant atom source gases.

6 Claims, 2 Drawing Figures

PLASMA ION DEPOSITION PROCESS

BACKGROUND OF THE INVENTION

1. Field of the Invention

The present invention relates generally to plasma ion deposition processes and, more particularly, to a plasma ion deposition process of large-grain, thin semiconductor films directly on low-cost amorphous substrates.

2. The Prior Art

For the large scale photovoltaic conversion of sunlight into electric power, low-cost yet high efficiency solar cells are required. Most solar cells today are made from single-crystal silicon (Si) material. These single-crystal silicon materials are anything but low-cost, however. Typically, such single-crystal silicon materials are grown in furnances by long, high temperature annealing cycles of thin small-grain polycrystalline films. Further, thin small-grain polycrystalline silicon films also are converted to large-grain polycrystalline films by propagating a melt in the film, followed by its recrystallization. Propagation of the melt is effected by laser or electron beam scanning. A still further method involves the epitaxial growing of large-grain silicon films on the texture-etched surfaces of single-crystal silicon wafers. Each of these processes produces suitable materials for high efficiency solar cells but at excessive cost.

To reduce cost, various silicon film deposition techniques also have been explored. These include the chemical vapor deposition (CVD) and the low-pressure chemical vapor deposition (LPCVD) of poly-crystalline silicon films on silicon-dioxide layers. The grain sizes were, for the most part, unsuitable for high efficiency solar cells. The glow discharge plasma deposition and the RF discharge plasma technique have yielded but amorphous silicon materials. The recently perfected technique of evaporating silicon and dopant substances in separate crucibles by electron beam heating onto high temperature substrates results in satisfactory grain size (about ten to twenty microns, with a columnar structure) but also at high cost. The economical large scale manufacture of large-grain, thin silicon films suitable for making high efficiency solar cells therefrom has remained thus far a desirable but elusive objective.

SUMMARY OF THE INVENTION

It is a principal object of the present invention to overcome the above disadvantages by providing a plasma ion deposition process of large-grain, thin semiconductor films directly on low-cost amorphous substrates.

More specifically, it is an object of the present invention to provide a plasma ion deposition process that comprises ionizing a semiconductor-based gaseous compound, extracting high energy semiconductor ions therefrom, depositing the extracted ions on a low-cost amorphous substrate so as to permit the ions to coalesce into lattice clusters, and enhancing the grain growth of the clusters. Preferably, the semiconductor-based gaseous compound is silane (Si $H_4$), the extracted ions possess high surface mobilities, the ionizing is effected in a chamber by an electron-supported plasma, the plasma being a large volume, low pressure, high temperature plasma. Preferably, the process is effected in a vacuum environment at a slow initial deposition rate so as to maintain few the number of the lattice structures formed on the substrate, followed by a higher deposition rate, further enhancing rapid grain growth.

Other and further objects of the present invention will in part be obvious and will in part appear hereinafter.

The invention accordingly comprises the process of the present disclosure, the scope of which will be indicated in the appended claims.

BRIEF DESCRIPTION OF THE DRAWINGS

For a further understanding of the nature and objects of the present invention, reference is to be made to the following detailed description, which is to be taken in connection with the accompanying drawings, wherein.

DETAILED DESCRIPTION OF THE PREFERRED EMBODIMENT

In general, the present invention provides an economical process for the large scale manufacture of large-grain, thin semiconductor films directly on low-cost amorphous substrates. Preferably, the process of the invention employs a plasma ion deposition technique in which the plasma is characterized by being a large volume, low pressure, high temperature plasma. Further, the plasma preferably is electron-supported by a high current density electron field. Preferably, a magnetic field surrounds the high current density electric field, with both fields acting on electrons emitted by a cathode so as to increase their path lengths to an anode. Preferably, a semiconductor-based gaseous compound, such as silane (i.e., silicon hydride, Si $H_4$), is ionized in the plasma. High energy semiconductor ions are extracted therefrom and deposited directly on a low-cost amorphous substrate. Preferably, the extracted ions possess high surface mobilities, impact the substrate at various angles, and impact-heat the surface of the substrate upon the ions' impingement thereon. Preferably, the deposition is effected in two phases or stages: a "seeding" phase characterized by an initial slow rate of ion deposition, followed by a "grain-growth" phase characterized by a high-rate of ion deposition. Preferably, the semiconductor-based gaseous compound also incorporates dopant atom source gases. The resultant large-grain, thin semiconductor films then are fabricated into modules of solar cells with conversion efficiencies better than ten percent (10%) under maximum illumination with solar light on the ground at sea level (AM1).

Figure 1:
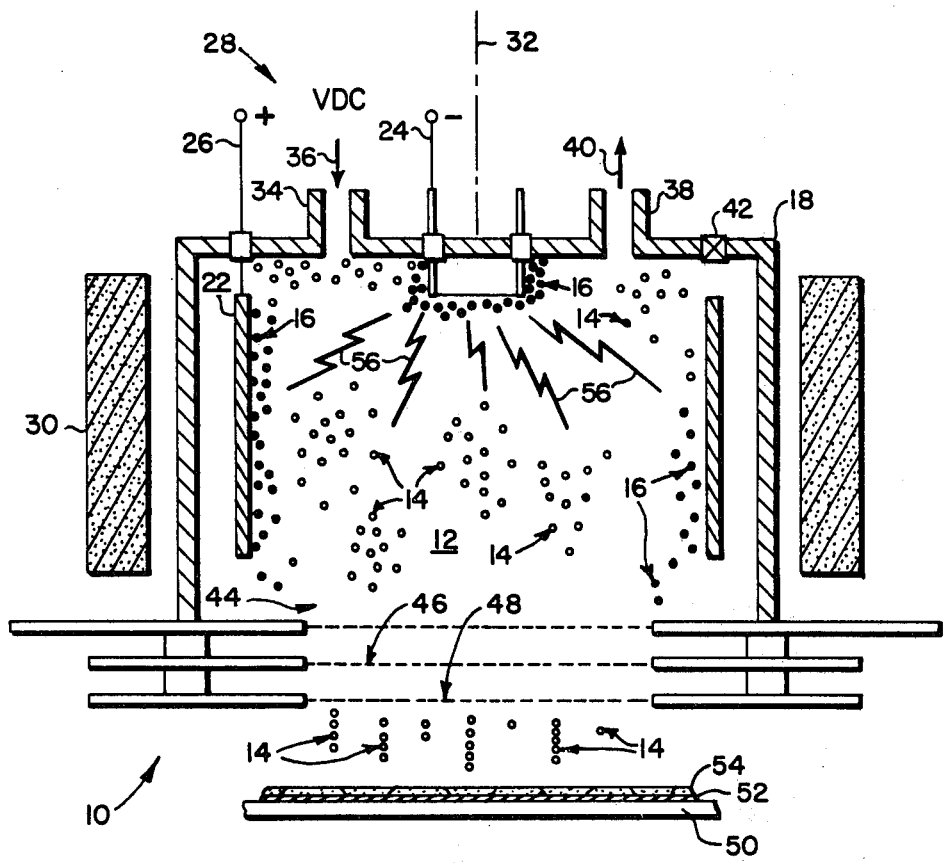
FIG. 1 is a schematic view of a preferred apparatus for use in practicing the process of the invention.

A schematic view of a preferred apparatus 10 for use in practicing the process of the invention is depicted in FIG. 1. Apparatus 10 is designed to produce a large volume, low pressure, high temperature plasma 12. (A "plasma" is a highly ionized, luminous gas which contains nearly equal numbers of positive and negative free charges in sufficient density so that the Debye shielding length is much smaller than the dimensions of the gas. The Debye shielding length is defined as a characteristic distance in a plasma beyond which the electric field of a charged particle is shielded by particles having charges of the opposite sign. Due to the presence of the positive and negative free charges, the plasma is considered to be a gaseous conductor. As such, a plasma readily interacts with a magnetic field.) The plasma 12 is shown including a plurality of ions 14 (the positive free charges) and a plurality of electrons 16 (the negative free charges).

The plasma 12 preferably is produced within a suitably biased discharge chamber 18. Preferably, chamber 18 is cylindrical in shape and formed of a metal such as stainless steel. The inside of the chamber 18 preferably is maintained at a vacuum of about $1 \times 10^{-6}$ torr by a suitable high vacuum pump, not shown. Preferably, the plasma 12 is electron-supported by a high current density electric field. The electron source preferably is a thermionic cathode 20 mounted coaxially within the chamber 18. A cylindrical anode 22 is disposed concentrically about the cathode 20. Leads 24 and 26, respectively, couple the cathode 20 and the anode 22 to a constant voltage DC source 28 (VDC). VDC 28 preferably is about 30 to 50 volts. Outside the chamber 18 and concentric therewith is mounted a magnet coil 30 whose magnetic field lines are parallel to the chamber axis 32. Magnet coil 30 preferably possesses a magnetic induction—"B"—of about thirty to about one hundred Gauss. (Magnetic induction—"B"—is a vector quantity that is used as a quantitative measure of magnetic field; also known as magnetic flux density.) Electrons 16 emitted by the cathode 20 and attempting to reach the anode 22 by crossing the magnetic field lines generated by the magnet coil 30 are subjected to an "E"×"B" force. This "E"×"B" force causes the electrons 16 to spiral, increasing thereby their path lengths and, consequently, their ionization efficiency.

Figure 2:
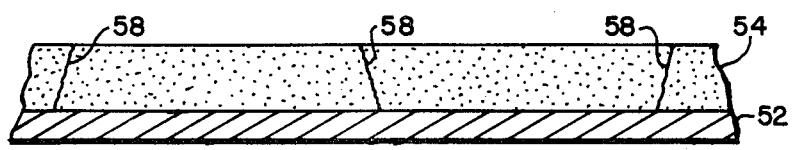
FIG. 2 is a schematic cross-sectional view, on an enlarged scale, of a large-grain, thin semiconductor film deposited directly on an amorphous substrate according to the process of the invention.

The chamber 18 furthermore is provided with a suitable inlet 34. It is via this inlet 34 that a semiconductor-based gaseous compound 36, as represented by an arrow, is admitted into the chamber 18. This semiconductor-based gaseous compound 36 comprises up to four feed gases, preferably including silane and dopant atom source gases, such as $PH_3$ and $B_2H_6$. Because of the explosive nature of silane and the toxic characteristics of these and other dopant gases, the chamber 18 preferably also is provided with an exhaust outlet 38 under appropriate exhaust controls 40, as represented by a further arrow. It also is advisable to provide the chamber 18 with an automated vent 42 to become operational during an emergency shutdown or an electrical power failure. The discharge region 44 of the chamber 18 is shown provided with a number of grids, including an electron suppression grid 46 and an ion extraction grid 48. Adjacent the discharge region 44 is disposed a platen 50. The platen 50 is designed to support a suitable low-cost, amorphous substrate 52, suitable to receive the plasma ion deposition of a large-grain, thin semiconductor film 54 thereon. A schematic cross-sectional view, on an enlarged scale, of the large-grain, thin semiconductor film 54 plasma ion deposited directly on the low-cost amorphous substrate 52 according to the process of the invention is illustrated in FIG. 2. This process will now be described.

The semiconductor-based gaseous compound 36 is introduced into the chamber 18 via the inlet 34 from a source of supply, not shown. This source is designed with precise, independent mass flow control of the up to four feed gases comprising the gaseous compound 36 so as to assure its desired mixture. As mentioned, the preferred gas is silane, together with appropriate dopant atom source gases. Other semiconductor materials, in gaseous form, can be used equally well in the process of the invention. These semiconductor materials include selenium, boron, germanium, cadmium sulfate, cadmium telluride, gallium arsenide, and the like. Upon introduction into the chamber 18, the semiconductor-based gaseous compound 36 is ionized therein in the large volume, low pressure, high temperature plasma 12. (The term "ionization" as used in this specification and in the appended claims is intended to define a process step by which an atom loses one or more electrons, acquiring thereby a net positive electric charge and becoming thus an ion. Ionization occurs as a result of the dissociation of the atoms of the gas molecules in an electric field.) The preferred plasma 12 temperature is about twenty-five keV. The plasma 12 preferably is electron-supported by electron impact ionization of the silane feed gas molecules. The electron source is the thermionic cathode 20. A series of electric arcs 56 emanating from the cathode 20 accelerate the emitted electrons 16. The ionization efficiency of the accelerated electrons 16 is further enhanced by the magnetic field generated by the magnet coil 30. As the electrons 16 experience the "E" times "B" force previously discussed, they begin to spiral, increasing thus their path lengths on their way to the cylindrical anode 22. Due to their increased path lengths, the accelerated spiraling electrons 16 effect more ionizing collisions and yet maintain an effectively low pressure density plasma 12.

The employment of such a large-volume, low pressure density, high temperature plasma 12 in the process of the invention results in the extraction from the gaseous compound 36 of very high energy, positively charged silicon ions 14, if silane was one of the feed gases, as preferred. The energy level of these silicon ions 14 in the plasma 12 is about five eV. These ions 14 progressively lose energy in various stages of their deposition from the plasma 12 onto the surface of the amorphous substrate 52. Due to their very high energies, the ions 14 possess high surface mobilities when the impinge on the surface of the substrate 52. The high surface mobilities of these ions 14 upon their impingement on the surface of the substrate 52 are responsible, in a large measure, for the large grain growth in the deposited thin semiconductor film 54. The ions 14, upon impingement, diffuse rapidly over the surface of the substrate 52 and have a lower probability of attaching themselves at a ledge or kink than at an already established lattice cluster site. Consequently, the already established lattice cluster can grow by the adhesion thereto of further ions 14. Such further ions 14 come, for the most part, from further depositions from the plasma 12, but also from adjacent lattice clusters which are smaller than a critical size. The attainment of the critical size of a lattice cluster creates the energetically favorable conditions for further and rapid growth of the cluster. Such cluster growth can be at the expense of a neighboring lattice cluster which has not yet attaind the critical size and is, therefore, vulnerable to decay by the loss of ions 14. Consequently, there are progressively fewer and fewer atom attachment sites, i.e., lattice clusters that have attained the critical size. These critical size lattice structures then grow, at a progressively accelerated rate, also by depleting ion concentrations between adjacent viable lattice structures, eventually resulting in the large-grain size, thin film 54. This tendency for the impinging ions 14 to adhere to preexisting lattice clusters which have attained the critical size also is related to the angle at which the ion 14 encounters the lattice cluster. By controlling this angle of encounter, i.e., by keeping the angle of impingement of the ions 14 on the surface of the substrate 52 large and at various angles, grain growth is further enhanced. During this, what might be called "seeding" phase of the deposition, it is preferable to use an initially slow deposition rate of these high energy ions 14 to maximize their surface diffusion and to keep the establishment, formation and growth of viable lattice clusters at a minimum. The number of these vaiable lattice clusters during this "seeding" phase also is kept low by employing a plasma 12 which is a large volume, low pressure, high temperature plasma so as to result in a low iron substrate flux at the time of the ions 14 impact on the surface of the substrate 52.

In addition to the energy levels and the flux rate of the depositing ions 14, further factors governing grain growth include the temperature, the type and the surface structure of the low-cost amorphous substrate 52 used. For, although the temperature of the plasma 12 is very high (about twenty-five keV, equivalent to a thermal temperature of about 50,000° C.), the thermal temperature of the substrate 52 and of the film 54 deposited thereon is, by comparison, very low, ranging from ambient to about 950° C. This relatively low deposition temperature allows for some latitude in the selection of the type of low-cost amorphous substrate 52 to be utilized in the process. In addition, the low deposition temperature results in lower shear stresses and in reduced substrate contamination of the deposited thin film 54. Considerations for choice of substrates 52 include: (a) those most likely to demonstrate large grain growth, e.g., molybdenum; (b) low-cost substrates, e.g., steel; and (c) substrates which do interact with the deposited thin semiconductor film 54, e.g., refractory metals and glass. Additionally, the employment of amorphous substrates 52 designed to release the thereon deposited thin semiconductor film 54, following its metallization and encapsulation, also is within the purview of the process of the invention.

The above-mentioned high surface mobilities of the high energy ions 14 upon their impingement on the surface of the substrates 52 can be further increased by raising the temperature of the substrate 52 above ambient. This can be effected by heating the substrate 52 directly or, as preferred, by impact heating the surface of the substrate 52 with the impinging high energy ions 14 themselves. Such impact heating of the surface of the substrate 52 has the additional advantage of insuring the release of any hydrogen gas which may become temporarily tapped in the deposited thin film 54 during its plasma ion deposition. As will be appreciated by those skilled in the art, the surface of the amorphous substrate 52 should be clean during plasma ion deposition in order to achieve large grain growth. One preferred way to accomplish in situ cleaning of the substrate 52 is via ion beam sputtering by applying a higher negative potential to the substrate 52 than is applied to the ion extraction grid 48.

Following the initial slow deposition rate of the extracted ions 14, which rate preferably not exceed twenty-five microns per hour during the "seeding" phase of the deposition, the deposition rate is considerably increased, preferably to more than fifth microns per hour. This accelerated rate of ion deposition further enhances grain growth. As mentioned, the energy level of the very high energy silicon ions 14 in the plasma 12 is about five eV. When these silicon ions 14 are absorbed on the surface of the substrate 52, their energy level is about two eV, and when they become a part of a rapidly growing viable lattice cluster, their energy level drops to about one-twentieth of an eV, representing their minimum energy state.

The resultant large-grain, thin semiconductor film 54, plasma ion deposited according to the process of the invention is characterized by reproducible, high purity material of a preferred thickness from about twenty to about one hundred microns, and a grain size between grain boundaries 58 from about one hundred to about two hundred microns, with a grain size of about twenty times two hundred microns being preferred.

Thus it has been shown and described a plasma ion deposition process, which process satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A process of plasma ion deposition of large grain, thin semiconductor films comprising:
   (a) ionizing a semiconductor-based gaseous compound;
   (b) extracting the semiconductor ions from said compound;
   (c) depositing said extracted ions on a substrate in two stages: at an initial slow deposition rate not exceeding 25 microns per hour, followed by a higher deposition rate greater than 50 microns per hour; and
   (d) permitting said deposited ions to coalesce and to grow into a large-grain, thin semiconductor film on said substrate.

2. The process of claim 1 wherein the plasma is electron-supported by a high current density electric field, and wherein the electron source for said electron-supported plasma is a thermionic cathode, and said high current density electric field is formed between said cathode and an anode coupled to a constant voltage DC source of about thirty to about fifty volts.

3. The process of claim 2 wherein a magnetic field surrounds said high current density electric field, both said fields acting on the electrons emitted by said cathode causing said electrons to spiral so as to increase their path lengths to said anode, enhancing said ionizing of said gaseous compound, and wherein said semiconductor-based gaseous compound also incorporates dopant atom source gases.

4. A process of plasma ion deposition of large-grain, thin semiconductor films on low-cost amorphous substrates, comprising:
   (a) ionizing a semiconductor-based gaseous compound in an electron-supported plasma of a temperature of about 25 keV;
   (b) extracting high energy semiconductor ions from said compound;
   (c) depositing said extracted ions possessing high surface mobilities on a low-cost amorphous substrate, while said ions during their said deposition impact-heat said substrate;
   (d) permitting said deposited ions to coalesce into lattice clusters; and
   (e) enhancing grain growth of said clusters of ions by controlling their said surface mobilities.

5. The process of claim 4 wherein said semiconductor-based gaseous compound is silane gas and said process is effected in a vacuum environment of about $10^{-6}$ torr maintained in said chamber.

6. A process of plasma ion deposition of large-grain, thin semiconductor films on low-cost amorphous substrates, comprising:
   (a) ionizing a semiconductor-based gaseous compound;
   (b) extracting high energy semiconductor ions from said compound;
   (c) depositing said extracted ions possessing high surface mobilities on a low-cost amorphous substrate, while said ions during their said deposition impact-heat said substrate;
   (d) permitting said deposited ions to coalesce into lattice clusters; and
   (e) enhancing grain growth of said clusters of ions by controlling their said surface mobilities;
   (f) said grain growth of said clusters of ions being further enhanced by controlling the angles of impingement of said extracted ions during their said deposition on said substrate.

* * * * *